(12) United States Patent
Cohen et al.

(10) Patent No.: US 6,350,625 B1
(45) Date of Patent: Feb. 26, 2002

(54) OPTOELECTRONIC PACKAGING SUBMOUNT ARRANGEMENT PROVIDING 90 DEGREE ELECTRICAL CONDUCTOR TURNS AND METHOD OF FORMING THEREOF

(75) Inventors: Mitchell S. Cohen, Bedford, MA (US); William K. Hogan, Rochester, MN (US); Sudipta K. Ray, Wappingers Falls, NY (US); James L. Speidell, Poughquag, NY (US); S. Jay Chey, Ossining, NY (US); Steven A. Cordes, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/753,272

(22) Filed: Dec. 28, 2000

(51) Int. Cl.[7] ........................ H01L 21/44; H01L 21/48; H01L 21/50; H01L 21/00
(52) U.S. Cl. .............................. 438/7; 438/27; 438/129; 438/125; 438/116
(58) Field of Search ................................ 438/116, 125, 438/129, 27, 7

(56) References Cited

U.S. PATENT DOCUMENTS

| 5,100,808 | A | * | 3/1992 | Glenn |
| 5,249,245 | A | * | 9/1993 | Lebby et al. |
| 5,804,464 | A | * | 9/1998 | Beilstein, Jr. et al. |
| 5,907,785 | A | * | 5/1999 | Palagonia |
| 6,207,473 | B1 | * | 3/2001 | Hirai et al. |

OTHER PUBLICATIONS

M.S. Cohen, et al. *Packaging Aspects of the Jitney Parallel Optical Interconnect*, consisting of 10 pages, No Date.
Paul Rosenberg, et al. *The Poni–1 Parallel–Optical Link*, Consisting of 6 pages, No Date.

* cited by examiner

*Primary Examiner*—John F. Niebling
*Assistant Examiner*—Josetta I. Jones
(74) *Attorney, Agent, or Firm*—Scully, Scott, Murphy & Presser; Paul J. Otterstedt, Esq.

(57) ABSTRACT

A novel optoelectronic packaging submount arrangement which incorporates a 90° C. electrical conductor turn, and more specifically methods of producing optoelectronic packaging submount arrangement incorporating 90° C. electrical conductor turns.

35 Claims, 2 Drawing Sheets

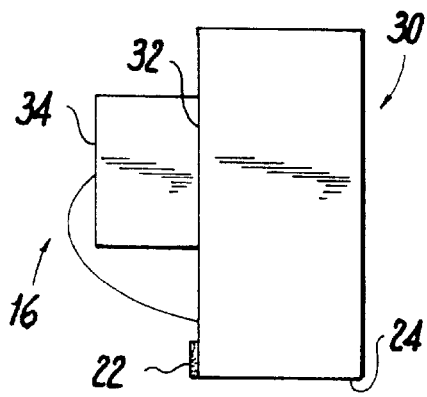
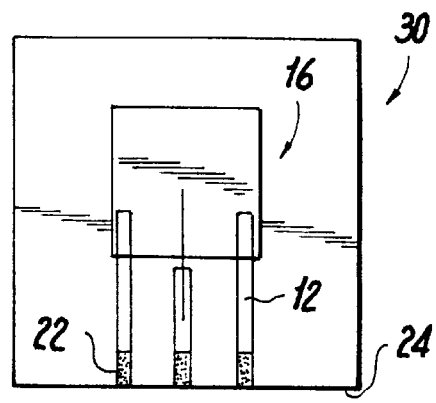
FIG. 3a  FIG. 3b
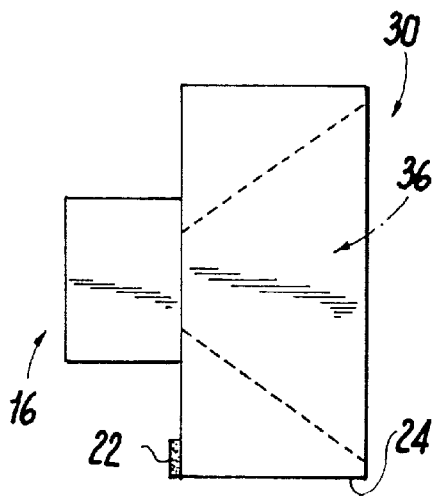
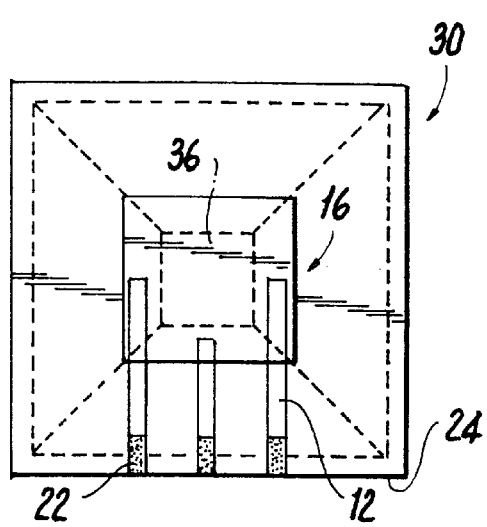
FIG. 4a  FIG. 4b
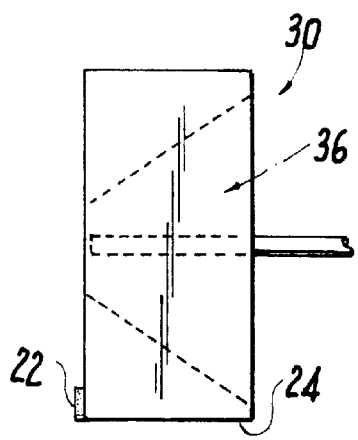
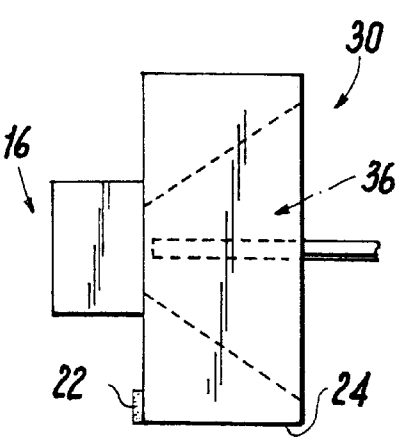
FIG. 5a  FIG. 5b

US 6,350,625 B1

OPTOELECTRONIC PACKAGING SUBMOUNT ARRANGEMENT PROVIDING 90 DEGREE ELECTRICAL CONDUCTOR TURNS AND METHOD OF FORMING THEREOF

BACKGROUND OF THE INVENTION

1. Field of the Invention

The present invention relates to the provision of a plurality of diverse and novel optoelectronic packaging submount arrangements each of which incorporates a 90° C. electrical conductor turn. Moreover, the invention is further directed to the provision of novel methods of producing diverse optoelectronic packaging submount arrangements each incorporating 90° C. electrical conductor turns.

In order to conserve space in optoelectronic packaging it is generally desirable, and even frequently necessary, to position the optical fibers delivering the signals in a plane which is nearly coincident with the plane of the electronic board on which the transmitter, receiver, or transceiver module is based. A packaging problem which is perennially encountered in industry is presented by the fact that light must impinge against the face of receiver chips, while it is emitted from the face of VCSEL (vertical-cavity surface-emitting laser) chips which are employed as light emitters, so that when these optoelectronic chips are mounted on the electronic board, the light paths associated with the chips extend perpendicular to the axes of the optical fibers. This problem may be solved by either mounting the chips in the plane of the board and bending the optical path between the chips and the fibers by 90° C., or alternatively, by mounting the chips perpendicular to the plane of the board and bending or turning the electrical conductor paths between the chips and the board by 90° C.

2. Discussion of the Prior Art

In essence, the solution to the above-mentioned problems has been successfully pursued in the technology. However, the optical bend presents a challenging optical design problem, and the component which is utilized for the implementing of the bending process can be expensive and difficult to fabricate, as is described in M. S. Cohen et al. "Packaging Aspects of the Jitney Parallel Optical Interconnect", Proc. 48th ECTC, pp. 1206–1215, 1998. In contrast with optical bending, the bending of an electrical conductor through an angle of 90 ° C. is relatively easily accomplished. For instance, a common implementation of such an electrical conductor bend of optoelectronic packaging involves the use of a flexible circuit, as described in P. Rosenberg, et al. "The PONI-1 Parallel-Optical Link", Proc. 49th ECTC, pp. 763–769, 1999. However, such a flexible circuit implementation is costly and often is difficult to manipulate within very confined spaces. These frequently encountered problems are exacerbated as the data rates of the optoelectronic packaging increase, and consequently, the electrical paths are required decrease to in their lengths.

In order to solve this problem it has heretofore been proposed that electrical bending be used, but that each optoelectronic chip be mounted on a submount which incorporates electrical traces which provide a built-in 90° C. turn. The basic concept of a submount containing electrical traces with a built-in 90° C. turn, of course, is not new in the technology inasmuch as such submounts are commercially available, and for example, can be readily produced by depositing traces around a corner on a ceramic piece using thick-film screening technology.

SUMMARY OF THE INVENTION

Although basic principles in the production of optoelectronic packaging submount arrangements which incorporate 90° C. electrical conductor turns are generally known and employed in the technology, the present invention improves upon various important aspects thereof. In particular, pursuant to the invention, a number of advantages are derived thereby, as follows:

(a) A large number of submounts can be concurrently fabricated in parallel on a silicon wafer through the use of photolithography. This, in essence, will considerably reduce manufacturing expenditures so as to render it highly cost-effective.

(b) The dimensions of the traces being formed can be controlled precisely by the employment of the photolithography, in view of which they can be designed for high data-rate operation.

(c) The silicon material which is used for the submount facilitates a good degree of heat dissipation from the optoelectronic chip.

(d) The silicon material which is used for the submount, if desired, enables the fabrication of active devices on the submount.

(e) Finally, it is also possible to etch features into the submount which will aid in the packaging.

Accordingly, it is an object of the present invention to provide an optoelectronic packaging submount incorporating a 90° C. electrical conductor turn.

Another object of the present invention is to provide a plurality of optoelectronic packaging submounts having 90° C. electrical conductor turns as described herein, which may be concurrently and in parallel manufactured on a silicon wafer.

Yet another object of the present invention is to provide novel methods of producing optoelectronic packaging submounts having 90° C. electrical conductor turns in a highly economical and cost-effective manner.

BRIEF DESCRIPTION OF THE DRAWINGS

Reference may now be made to the accompanying drawings representative of the production of optoelectronic packaging submounts pursuant to the invention; in which:

FIGS. 3a and 3b illustrate, respectively, side and front views of the die and wire bonding of a VCSEL on a submount; (a photodetector chip may be mounted in a similar fashion);

FIGS. 4a and 4b illustrate, respectively, side and front views of the submount modified for the flip-chip mounting of a VCSEL (a photodetector chip may be mounted in a similar fashion); and FIGS. 5a and 5b illustrate, respectively, side views representing the arrangement of FIGS. 4a and 4b together with the incorporation of a fiber to convey light to or from the optoelectronic chip.

DETAILED DESCRIPTION OF PREFERRED EMBODIMENTS

Figure 1:
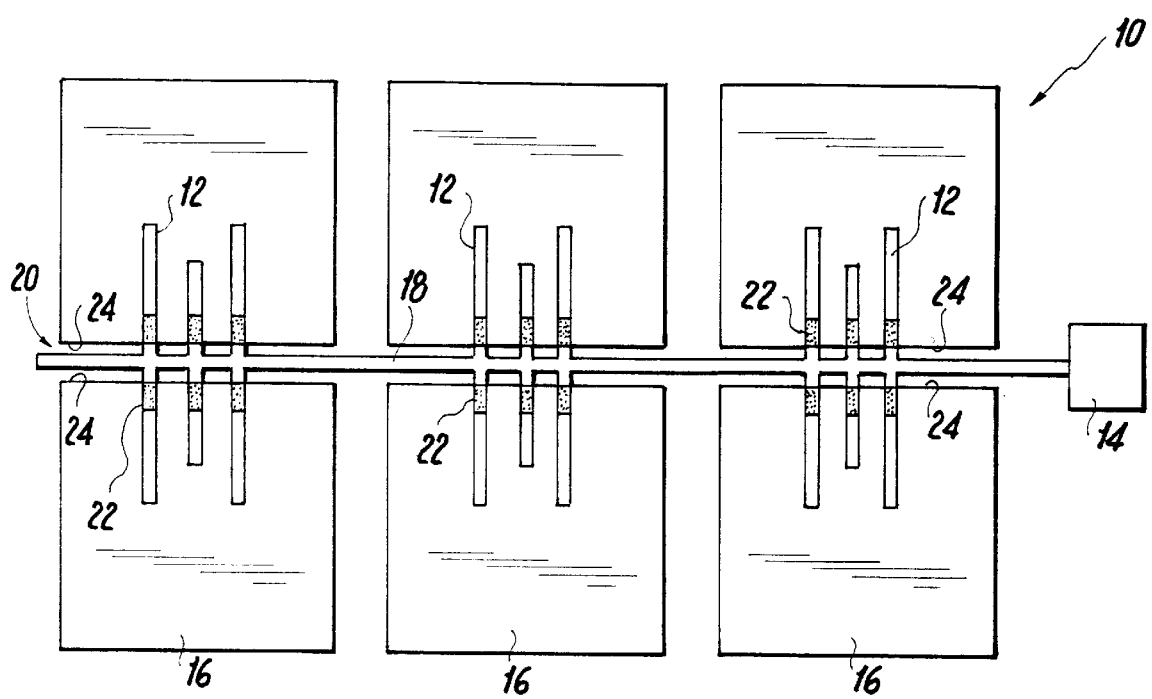
FIG. 1 illustrates, in a schematic representation, the fabrication of submounts on a silicon wafer.

Referring in specific detail to the drawings, and particularly to FIG. 1, the following steps are employed in a procedure of fabricating the optoelectronic submounts 10:

1. Conductive traces 12 and associated electroplating pads 14 are delineated on all of the (undiced) chips 16 of a wafer using standard lithographic technology.

2. The lithography as set forth in step 1 also serves to delineate conductors 18 in the kerf region 20 between rows of chips 16. These conductors 18 are electrically connected to traces 12 in the chips 16. For example, as shown in FIG. 1, the traces 12 are connected in every other row of chips 16.
3. A second lithographic operation is used to create a photoresist mask (not shown) covering all regions of the chips 16 except for small windows 22 opened over the traces proximate the chip edge 24. Each window 22 starts about 1 to 20 $\mu$m from the chip edge 24 and extends about 50–100 $\mu$m further away from the chip edge, as shown in the dark regions in FIG. 1.
4. The wafer is immersed in an electroplating bath, contacts are made to the traces 12 located in the kerfs and the window regions 22 are plated up to a thickness of about 50–100 $\mu$m.
5. The resist is removed and the wafer is diced into the chips 16. During dicing, all of the conductors 18 in the kerf regions 20 are sawn away.

Alternatively, instead of making contact with the traces 12 which are being electroplated by the method set forth hereinabove, the conductors 18 in the kerf regions 20 can also be omitted. Instead of the foregoing, a very thin metal film may be blanket deposited on the bare wafer in the first processing step; in which this thin layer serves to provide electrical contact for the electroplating step. The other processing steps follow as outlined hereinabove, however the final step before dicing; in effect, after resist removal; would be implementing the etch-off of the blanket thin-film conductive layer. Even if some of the desired metallurgy were to be inadvertently removed by this etching step it would be of no consequence, since only a short etch is needed to remove the thin metal of the conductive layer.

Figure 2A:
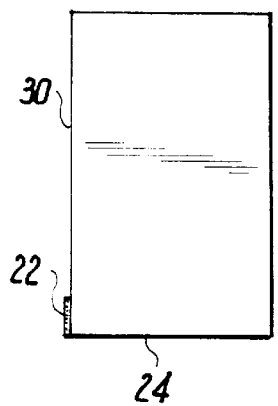
FIGS. 2a and 2b illustrate, respectively, side and front views of a completed submount.
Figure 2B:
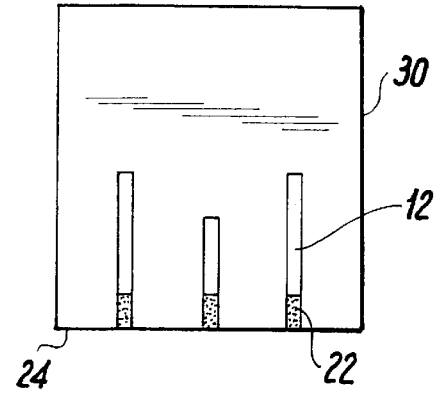

Referring to FIGS. 2a and 2b, there is shown a completed submount 30 in which, for purposes of illustration only, typical dimensions are given (in mm) which may be appropriate for VCSEL mounting. It is ascertainable that the traces 12 have been thickened in each electroplated region 22 to about 50 or 100 82 m. The optoelectronic chip 16 can now be diebonded (and wirebonded) on the submount 30 following the usual procedures known in the technology.

purpose of the thickened electroplated regions 22 on the traces 12 is to provide good anchoring regions for soldering to the wiring board. The traces on the board are to be provided with solder bumps. Heat is applied, the bumps are melted, and the submount 30 is lowered into the solder bumps so that the solder wets the electroplated regions before freezing. Care must be taken to choose a metallurgy which will permit electroplated regions to be robust, yet solderable. Such a metallurgy may be a thick layer of copper or nickel, followed by a layer of gold.

Alternatively, the thickened electroplated regions 22 on the traces 12 may represent solder bumps which are electroplated. In this case the solder bumps on the submount are soldered to the solder bumps on the board, i.e., the two juxtaposed solder bumps are fused together.

Furthermore, it may be noted that in production the typical accuracy for placement of a sawcut has been ±20 $\mu$m, although precision wafer saws have a placement accuracy of ±1 $\mu$m. Since sawing into the thick electroplated layer could damage the latter, the electroplated region 22 is designed to be displaced from the nominal chip edge 24 by 1–20 $\mu$m, depending on the precision of the saw. Since the solder bump on the board may have a height of as much as 100–300 $\mu$m, the electroplated region will nevertheless be immersed in the solder.

Although the solder will provide a secure electrical connection, the solder bond may not be adequate for mechanical integrity. For this reason an adhesive, such as an epoxy, may be applied to produce a robust fillet between the submount and the board, such as on the opposite side of the submount 30 from the traces 12.

The optoelectronic chips 16 which are to be die bonded to the submount 30 are preferably attached with AuSn eutectic solder, which may be applied without use of solder flux, and which evidences a good stability. It is therefore necessary to identify a solder for the solder bump which melts at a lower temperature than AuSn (280° C.) so that the positions of the optoelectronic chips 16 are not disturbed during solder-bump reflow. Since a commonly used earlier employed solder, such as 97%/3% PbSn has a melting point of about 300° C., a lower temperature solder is needed. In this connection, recently developed Pb-free solders may be used for this application; for example, an SnAgCu solder which has a melting point of 217° C. Other solder options are: Sn/5%Sb (mp: 235 C.), Sn/Bi/Ag (92 Sn, 4–5% Bi, 3–4% Ag; mp:211° C.). The added advantage of these solder systems is that they enable these packages to be Pb-free which, in industry, is increasingly a requirement for electronic and optoelectronic packages.

Alternatively, it is of course possible to employ electrically conductive materials other than solder in order to make the electrical connection between the submount and the board. Such materials could include conductive epoxies of various types.

As illustrated in FIGS. 3a and 3b, there is represented an example as to the manner in which an optoelectronic chip 16 could be attached to the submount 30 where an active-side up VCSEL chip 16 is shown diebonded to the substrate 30 with a wirebond to an appropriate trace 12. Here, it is assumed that the bottom face 32 of the VCSEL 16 (contacting the submount) represents one of its electrical terminals, whereas the other VCSEL terminal lies in its top (active) face 34, and is accessible by a wire bond. The light is emitted from the top face 34 in a direction away from the submount. A receiver chip can be attached to a submount in similar fashion, with its active face away from the substrate and the appropriate electrical connections made by wire bonds.

Alternatively, however, either the VCSEL 16 or the receiver chip can be flip-chip bonded to the submount 30 so that the electrical connections would be made by direct solder connections to the traces. As is common for optoelectronic chips, AuSn solder could be used. A flip-chip mounting may be advantageous because the inductance associated with the wire bond is eliminated, thereby facilitating the achievement of higher data rates. However, since the silicon substrate is opaque at the shorter wavelengths often used in datacom applications (850 nm) it may be necessary to modify the submount to permit a free lightpath, with such a modification being illustrated in FIGS. 4a and 4b.

In that case, holes 36 are etched in the silicon substrate 30, and the optoelectonic chips 16 are mounted so as to straddle these holes. A standard anisotropic etching process may be used for this operation, as described in E. Bassous, "Fabrication of novel three-dimensional microstructures by the anisotropic etching of (100) and (110) silicon", IEEE. Trans Electron Devices, vol, ED25, pp 1178–1185; 1978.

However, care must be exercised to avoid damaging the traces during the hole-etching process, since a caustic solution is commonly used for etching. For this purpose, the following procedure is suggested, although alternative procedures may also be possible:

1. Deposit an inert base film (silicon nitride) on the front side of the wafer (the side view of FIG. 4a, i.e., the side to be used for delineating the traces).
2. Deposit the silicon-etch mask film (silicon nitride) on the back side of the wafer (view of FIG. 4b). Lithographically pattern that film so as to create the appropriate openings in the mask film for the silicon etching.
3. Etch the required holes in the silicon wafer. It is noted that the base film will remain stretched over the holes on the front side of the wafer.
4. Photolithograpically pattern the traces on the front side of the wafer. Because of the presence of the base film, photoresists may be applied successfully for lithography; this would not be the case in the absence of the base film because holes in the silicon would thwart the photoresist spinning operation.
5. Flip-chip bond the opoelectronic chips. Because of its transparency, the thin base film need not be removed under the chips to provide a free optical path.

It is noted that frontside-to-backside mask alignment is required for the above procedure. It is generally difficult to provide such alignment with high accuracy. However, high accuracy is not required in the present application because the etched hole need only be positioned accurately enough to ensure proper die bonding of the optoelectronic chip along with a free optical path.

Consideration must be given to the necessity of having to align each optoelectronic chip with its associated optical path, i.e., fiber. This alignment may be accomplished actively, such as by activating the VCSEL or the receiver chip, providing relative motion between the optoelectronic chip and the optical path until the electrical signal is optimized, then fixing the components in place in order to maintain their positions. Whereas active alignment can be carried out using the concepts outlined above, passive alignment may be a more attractive alignment procedure because of cost savings. In passive alignment the optoelectronic chip is not activated, but alignment is carried out with the aid of either (a) an mechanical alignment feature or (b) fiducial marks used as reference features. Two methods of passive alignment utilizing the optoelectronic submount are set forth hereinbelow, each of which entails butt-coupling a fiber to the optoelectronic chip (no lens involved).

(a) Passive Alignment Using Mechanical Features

Methods for fabricating fiber guides directly on optoelectronic chips have been described in copending U.S. patent application Ser. No. 09/479,109, filed Jan. 7, 2001, the disclosure of which is incorporated herein by reference. If such guides were fabricated on the chips, they would be accessible for fiber insertion either for active-side up, as in FIGS. 3a and 3b or active-side down, as in FIGS. 4a and 4b. In the latter instance, the fiber would be inserted into the fiber guide through the hole which is etched in the silicon.

(b) Passive Alignment Using Precision Die Placement Tool

Since high precision (±1 $\mu$m) production die-placement tools are commercially available for flip-chip bonding, it is expedient that such tool be used in order to place the optoelectronic chip precisely in position relative to the fiber. In that case, a submount fabricated with an etched hole for flip-chip mounting would be used, as in FIGS. 4 and 4b. The procedure employed is illustrated in FIGS. 5a and 5b.

First, as shown in FIG. 5a, the fiber is threaded into the submount hole from the back side. It is pushed against a special temporary stop so that the fiber end is not flush with the front surface of the submount, but is slightly retracted therefrom (approximately 10–20 $\mu$m, for example). The fiber is then fixed in place with a suitable adhesive, such as UV-crosslinked epoxy, and the stop is then removed. It is noted that it is not necessary to align the fiber with respect to the sides of the hole; it should merely be positioned roughly near the center of the hole.

A circle is an ideal object for recognition and centroid determination by a machine vision system. The fiber ends present just such an object for the vision system of the die-placement tool. For example, either the outside diameter of the fiber could be used as a fiducial mark, or alternatively, visible light could be directed into the fiber and the illuminated fiber core could be used for that purpose. It may be assumed that corresponding fiducial marks which are keyed to the position of the optically active areas are fabricated on the optoelectronic chips. The flip-chip die-placement tool then aligns those fiducial marks to the image of the fiber end with excellent accuracy, and die bonds the chip on the submount, as shown in FIG. 5b.

(c) Application to Arrays

The foregoing description has been directed to the alignment of a single fiber to a single optoelectronic elements. However, these concepts may be readily extended to the alignment of an array of fibers to a chip containing an array of optoelectronic elements.

If the fiber-guide concept as described hereinabove is used in this case, it is possible to insert and fix fibers sequentially into the various fiber guides of the array chip. However, it is more cost-effective to insert an array of fibers simultaneously into the array of fiber guides. If, as is customary, the fibers are captured in a holder (such as an array of V grooves precision etched in silicon), the fiber-fiber spacing can be held to within ±1 $\mu$m; the optoelectronic elements on the chip are also spaced accurately since they are made by photolithographic means. Consequently, it is then necessary only to guide the fibers at either end of the fiber array into their respective fiber guides inasmuch as the remaining fibers will automatically be correctly inserted. For this purpose, it is necessary to fabricate the fiber array in a manner such that the fibers protrude slightly from the end of their holder. Since the protrusion need only be a fraction of a mm, the fibers will be stiff enough to maintain their relative positions. Alternatively, the flip-chip concept, as described hereinabove, may be used for arrays.

While it is apparent that the invention herein disclosed is well calculated to fulfill the objects stated above, it will be appreciated that numerous modification and embodiments may be devised by those skilled in the art, and it is intended that the appended claims cover all such modifications and embodiments as fall within the true spirit and scope of the present invention.

What is claimed is:

1. A method for concurrently fabricating a plurality of optoelectronic packaging submounts providing for 90° C. electrical conductor turns; comprising:
   (a) providing a wafer having a surface initially defining a plurality of undiced semiconductor chips;
   (b) delineating conductive traces and associated electroplating pads on each of said undiced chips;
   (c) delineating conductors in kerf regions intermediate selective rows of said chips;
   (d) covering said chips with a photoresist mask while leaving windows open over the traces proximate at least one edge of each of said chips;
   (e) immersing said wafer in an electroplating bath so as to form contacts to the traces in said kerf regions and plating the regions of said windows; and
   (f) removing said resist and dicing said wafer into individual said chips to provide said submounts.

2. A method as claimed in claim 1, wherein said conductive traces and associated electroplating pads are delineated lithographically.

3. A method as claimed in claim 2, wherein said lithographic delineation serves to delineate said conductors in said kerf regions, said conductors being electrically connected to said traces in the undiced chips.

4. A method was claimed in claim 1, wherein said traces are connected in every other row of said undiced chips.

5. A method as claimed in claim 1, wherein each said window starts at a distance of about 1–20 $\mu$m from the chip edge and extends away from said chip edge on the surface of each said chip for a distance of about 50–100 $\mu$m.

6. A method as claimed in claim 1, wherein the regions of said windows are plated to a thickness of about 50–100 $\mu$m.

7. A method as claimed in claim 1, wherein dicing said wafer into individual said chips causes removal of said conductors in said kerf regions.

8. A method as claimed in claim 1, wherein said wafer is constituted of a silicon material.

9. A method as claimed in claim 1, wherein a VSCEL or photodetector chip is mounted on each said submount through diebonding.

10. A method as claimed in claim 1, wherein a VSCEL or photodetector chip is mounted on each said submount and is wirebonded.

11. A method as claimed in claim 1, wherein the electroplated regions are solderable to juxtaposed solder bumps on an underlying substrate (board), said electroplated regions comprising a layer of copper or nickel and a superimposed thinner layer of gold.

12. A method as claimed in claim 1, wherein the electroplated regions consist of solder, thereby forming solder bumps, which are solderable to juxtaposed solder bumps on an underlying substrate (board), said electroplated regions comprising a layer of copper or nickel and a superimposed thinner layer of gold.

13. A method as claimed in claim 9, wherein said chips are diebonded to said submounts with a lead-free electric solder.

14. A method as claimed in claim 9, wherein said chips are bonded to said submount with a conductive epoxy material.

15. A method as claimed in claim 10, wherein said submounts are modified for flip-chip mounting of said VSCEL or photodetector chip, wherein a hole is etched into the submount to provide optical access to said chip.

16. A method as claimed in claim 1, wherein thickened electroplated regions on said traces form electroplated solder bumps, solder bumps on said submount being soldered to solder bumps on the board, whereby the juxtaposed said solder bumps are fused together.

17. A method for concurrently fabricating a plurality of optoelectronic packaging submounts providing for 90° electrical conductor turns; comprising:
(a) providing a wafer having a surface with a thin metallic film blanket layers deposited thereon initially defining a plurality of undiced semiconductor chips;
(b) delineating conductive traces and associated electroplating pads on each of said undiced chips;
(c) covering said chips with a photoresist mask while leaving windows open over the traces proximate at least one edge of each of said chips;
(d) immersing said wafer in an electroplating bath for plating the regions of said windows; and
(e) removing said resist, etching-off the blanket thin-metallic film blanket layer, and dicing said wafer into individual said chips to provide said submounts.

18. A method as claimed in claim 17, wherein said conductive traces and associated electroplating pads are delineated lithographically.

19. A method as claimed in claim 17, wherein each said window starts at a distance of about 1–20 $\mu$m from the chip edge and extends away from said chip edge on the surface of each said chip for a distance of about 50 –100 $\mu$m.

20. A method as claimed in claim 17, wherein the regions of said windows are plated to a thickness of about 50–100 $\mu$m.

21. A method as claimed in claim 17, wherein said wafer is constituted of a silicon material.

22. A method as claimed in claim 17, wherein a VSCEL or photodetector chip is mounted on each said submount through diebonding.

23. A method claimed in claim 17, wherein a VSCEL or photodetector chip is mounted on each said submount and is wirebonded.

24. A method as claimed in claim 17, wherein the electroplated regions are solderable to juxtaposed solder bumps on an underlying substrate (board), said electroplated regions comprising a layer of copper or nickel and a superimposed thinner layer of gold.

25. A method as claimed in claim 17, wherein the electroplated regions consist of solder, thereby forming solder bumps, which are solderable to juxtaposed solder bumps on an underlying substrate (board), said electroplated regions comprising a layer of copper or nickel and a superimposed thinner layer of gold.

26. A method as claimed in claim 22, wherein said chips are diebonded to said submounts with a lead-free electric solder.

27. A method as claimed in claim 22, wherein said chips are bonded to said submount with a conductive epoxy material.

28. A method as claimed in claim 23, wherein said submounts are modified for flip-chip mounting of said VCSEL or photodetector chip, wherein a hole is etched into the submount to provide optical access to said chip.

29. A method as claimed in claim 17, wherein thickened electroplated regions on said traces form electroplated solder bumps, solder bumps on said submount being soldered to solder bumps on the board, whereby the juxtaposed said solder bumps are fused together.

30. A method as claimed in claim 28, wherein said modification of the submount comprises the steps of:
(1) depositing an insert base film of a silicon material on a front side of said wafer which delineates the traces;
(2) depositing a silicon-etch mask on a back side of the wafer, and lithographically patterning said film to create specified openings in said mask for silicon etching;
(3) etching required holes in said silicon wafer while enabling the base film to remain stretched over said holes on the front side of said wafer;
(4) photolithographically patterning the traces on the front side of said wafer; and
(5) flip-chip bonding the optoelectronic chips to said wafer.

31. A method as claimed in claim 30, wherein said etched hole facilitate accurate insertion therein of respectively an optoelectronic fiber, and fixing said fiber in position through the interposition of an adhesive.

32. A method as claimed in claim 30, wherein said base film and said mask film are each constituted of silicon nitride.

33. A method as claimed in claim 1, wherein said modification of the submount comprises the steps of:

(1) depositing an insert base film of a silicon material on a front side of said wafer which delineates the traces;

(2) depositing a silicon-etch mask on a back side of the wafer, and lithographically patterning said film to create specified openings in said mask for silicon etching;

(3) etching required holes in said silicon wafer while enabling the base film to remain stretched over said holes on the front side of said wafer;

(4) photolithographically patterning the traces on the front side of said wafer; and (5) flip-chip bonding the optoelectronic chips to said wafer.

34. A method as claimed in claim 33, wherein said etched hole facilitate accurate insertion therein of respectively an optoelectronic fiber, and fixing said fiber in position through the interposition of an adhesive.

35. A method as claimed in claim 33, wherein said base film and said mask film are each constituted of silicon nitride.

* * * * *

UNITED STATES PATENT AND TRADEMARK OFFICE
CERTIFICATE OF CORRECTION

PATENT NO.    : 6,350,625 B1
DATED         : February 26, 2002
INVENTOR(S)   : M. S. Cohen et al.

It is certified that error appears in the above-identified patent and that said Letters Patent is hereby corrected as shown below:

<u>Column 3,</u>
Line 43, before "purpose" insert -- The --

<u>Column 8,</u>
Line 38, "VCSEL" should read -- VSCEL --

Signed and Sealed this

Tenth Day of September, 2002

Attest:

JAMES E. ROGAN
Attesting Officer    Director of the United States Patent and Trademark Office